United States Patent [19]

Drake et al.

[11] Patent Number: 4,975,143
[45] Date of Patent: Dec. 4, 1990

[54] KEYWAY ALIGNMENT SUBSTRATES

[75] Inventors: Donald J. Drake, Rochester; Michael R. Campanelli, Webster; Thomas A. Tellier, Williamson, all of N.Y.

[73] Assignee: Xerox Corporation, Stamford, Conn.

[21] Appl. No.: 440,211

[22] Filed: Nov. 22, 1989

[51] Int. Cl.5 ............ B44C 1/22; H01L 21/306; B32B 31/00; B31F 5/00
[52] U.S. Cl. ............................ 156/633; 156/644; 156/647; 156/657; 156/659.1; 156/299; 156/304.1; 156/556; 269/21
[58] Field of Search ............... 156/629, 630, 633, 643, 156/644, 645, 647, 653, 657, 659.1, 662, 668, 299, 304.1, 304.5, 556, 558, 560; 269/21; 29/743, 739; 204/15

[56] References Cited

U.S. PATENT DOCUMENTS 3,992,236 11/1976 Wanesky .................. 156/299 X
4,690,391 9/1987 Stoffel et al. ................ 269/21

Primary Examiner—William A. Powell
Attorney, Agent, or Firm—Oliff & Berridge

[57] ABSTRACT

The vacuum hold down alignment substrate is formed as an array of precisely aligned alignment substrate subunits. Each subunit is formed with an alignment pattern formed in a photo-patternable or electroformable material. When the plurality of alignment substrate subunits are formed into an array to produce the alignment substrate, the alignment patterns are aligned to receive corresponding patterns in discrete subunit devices which are aligned into an array on the alignment substrate.

46 Claims, 11 Drawing Sheets

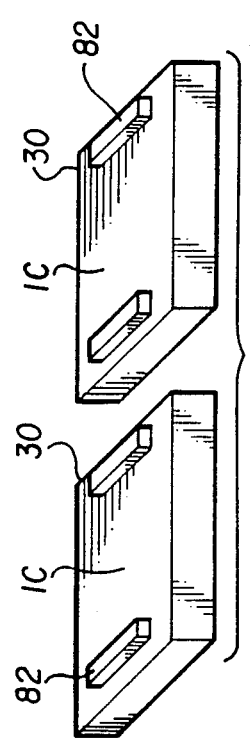
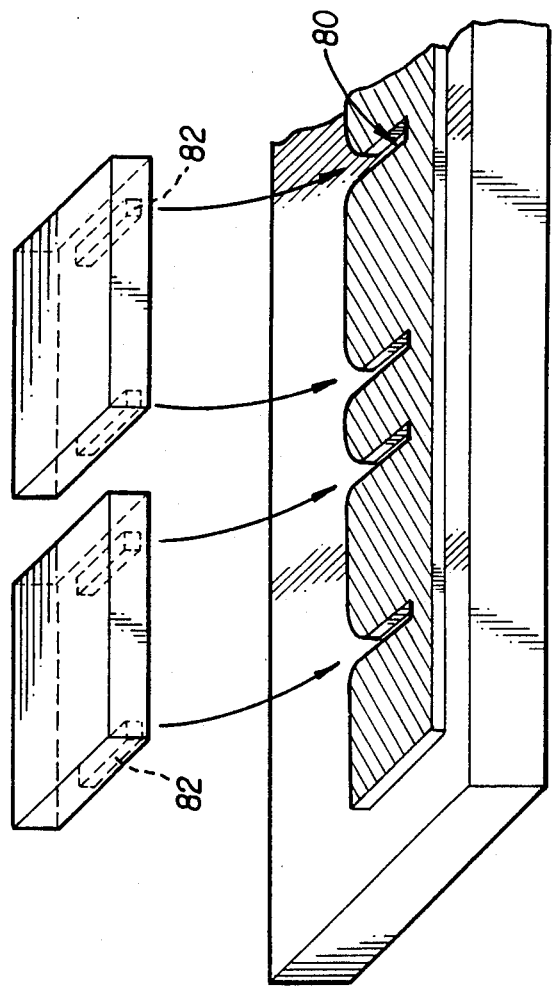

KEYWAY ALIGNMENT SUBSTRATES

BACKGROUND OF THE INVENTION

1. Field of the Invention

The invention relates to alignment substrates upon which extended arrays of discrete (silicon wafer) subunits (or chips) can be assembled into full width arrays The invention also relates to methods of making these alignment substrates and methods of using same. The invention can be used with or without vacuum holddown structures for maintaining the position of the subunit.

2. Description of Related Art

With the increased interest in rastor scanners, both to read and write images, has come renewed demand in the art for an economical full width scanning array. In the current stage of scanner technology, the art is without a commercially acceptable and economically feasible method of producing very long unitary scanning arrays, that is, single arrays of sufficient linear extent and with the requisite number of image processing elements to scan an entire line at once with a high image resolution. In this context, when speaking of scanning arrays, there are both image reading arrays which comprise a succession of image sensing elements to convert the image line to electrical signals or pixels, and image writing arrays which comprise a succession of light producing or other elements employed to produce images in response to an image signal or pixel input.

The prior art has faced this failure or inability to provide long full width scanning arrays with various proposals. These include optical and electrical arrangements for overlapping plural shorter arrays and abutting short arrays together in end-to-end arrangements. However, none of these proposals has met with any great degree of success. For example, in the case of abutting smaller arrays together, due to the difficulty of exactly aligning and mating the array ends with one another, losses and distortion of the images often occur.

A similar problem arises with thermal ink jet printheads. Thermal ink jet printheads are fabricated by using silicon wafers and processing technology to make multiple small heater plates and channel plates. This works extremely well for small printheads. However, for large array or pagewidth printheads, a monolithic array of ink channels or heater elements cannot be practically fabricated in a single wafer since the maximum commercial wafer size is six inches. Even if ten inch wafers were commercially available, it is not clear that a monolithic channel or heater array would be very feasible. This is because only one defective channel or heater element out of 2,550 channels or heater elements would render the entire channel or heater plate useless. This yield problem is aggravated by the fact that the larger the silicon ingot diameter, the more difficult it is to make it defect free. Also, relatively few 8½ inch channel plate arrays could be fabricated in a ten inch wafer. Most of the wafer would be thrown away, resulting in very high fabrication costs. Thus, there is also the need in the field of thermal ink jet printhead fabrication for a method of forming extended arrays of silicon wafer subunits.

Stoffel et al U.S. Pat. No. 4,690,391 discloses a method and apparatus for fabricating long full width scanning arrays for reading or writing images. For this purpose, smaller scanning arrays are assembled in abutting end to end relationship, each of the smaller arrays being provided with a pair of V-shaped locating grooves in the face thereof. An aligning tool having predisposed pin-like projections insertable into the locating grooves on the smaller scanning arrays upon assembly of the smaller arrays with the aligning tool is used to make a series of the smaller arrays in end to end abutting relationship, there being discretely located vacuum ports in the aligning tool to draw the smaller arrays into tight face-to-face contact with the tool. A suitable base is then affixed to the aligned arrays and the aligning tool withdrawn. A limitation with the tool of Stoffel et al is that the accuracy of the extended array is a function of the accuracy with which the alignment structures can be formed on the tool. The present invention is an improvement over the method disclosed by U.S. Pat. No. 4,690,391.

OBJECTS OF THE INVENTION

An object of the present invention is to provide an alignment substrate for fabricating an extended array of subunits which contains a series of alignment patterns for positioning and holding a series of subunits in precisely defined positions so as to form an extended array of subunits wherein the alignment patterns are formed by photopatterning.

Another object of the present invention is to provide a method of making an alignment substrate for use in aligning a plurality of subunits into an extended array.

A further object of the present invention is to provide a method of fabricating an extended array of (silicon wafer) subunits by using a keywayed alignment substrate having vacuum holes.

SUMMARY OF THE INVENTION

The present invention makes use of an alignment substrate having a series of photopatterned alignment patterns on an upper surface thereof which mate with alignment patterns formed on the subunits to be aligned. By the present invention, an alignment substrate is produced having precisely defined alignment patterns thus permitting precisely defined extended arrays of subunits to be produced. The alignment substrate may also include vacuum holes which enable the subunits to be maintained in position after proper placement on the photopatterned alignment substrate. The alignment substrate can be made from a (100) silicon wafer which permits precise location and dimensioning of the vacuum holes and alignment patterns by the use of well known photolithographic techniques.

The invention further relates to a method of making the alignment substrate for use in aligning a plurality of wafer subunits into an extended array. The alignment substrate can be made from a series of (100) silicon wafer substrate subunits which are precisely aligned to form the full length alignment substrate. The alignment patterns can be formed on an upper surface of the alignment substrate by patterning and partially removing a dry film resist which is laminated onto the upper surface of the alignment substrate. Alternatively, the alignment pattern can be formed by photopatterning a mask on a metal substrate and then electroforming the keyway pattern.

The invention further relates to a method of assembling an extended array of discrete subunits which makes use of the alignment substrate produced by the above method. A programmable automatic placement system can be used to pick up discrete subunits and place them on the alignment substrate. The automatic placement system can precisely position each subunit on the alignment substrate by insertion of alignment patterns formed on the subunits into the photopatterned alignment patterns of the alignment substrate. Once placed on the alignment substrate, vacuum applied through the vacuum holes of the alignment substrate secures the subunit which is then released by the placement system. Additional subunits are placed on the alignment substrate until an extended array of subunits is formed. This extended array is then bonded to form an integral extended array of subunits having the desired length.

BRIEF DESCRIPTION OF THE DRAWINGS

A preferred embodiment of the invention will be described in detail with reference to the following drawings in which:

FIGS. 12A and 12B are isomeric views of an alternate embodiment of an alignment substrate usable with chips having rectangular shaped keys.

DESCRIPTION OF THE PREFERRED EMBODIMENTS

Figure 1:
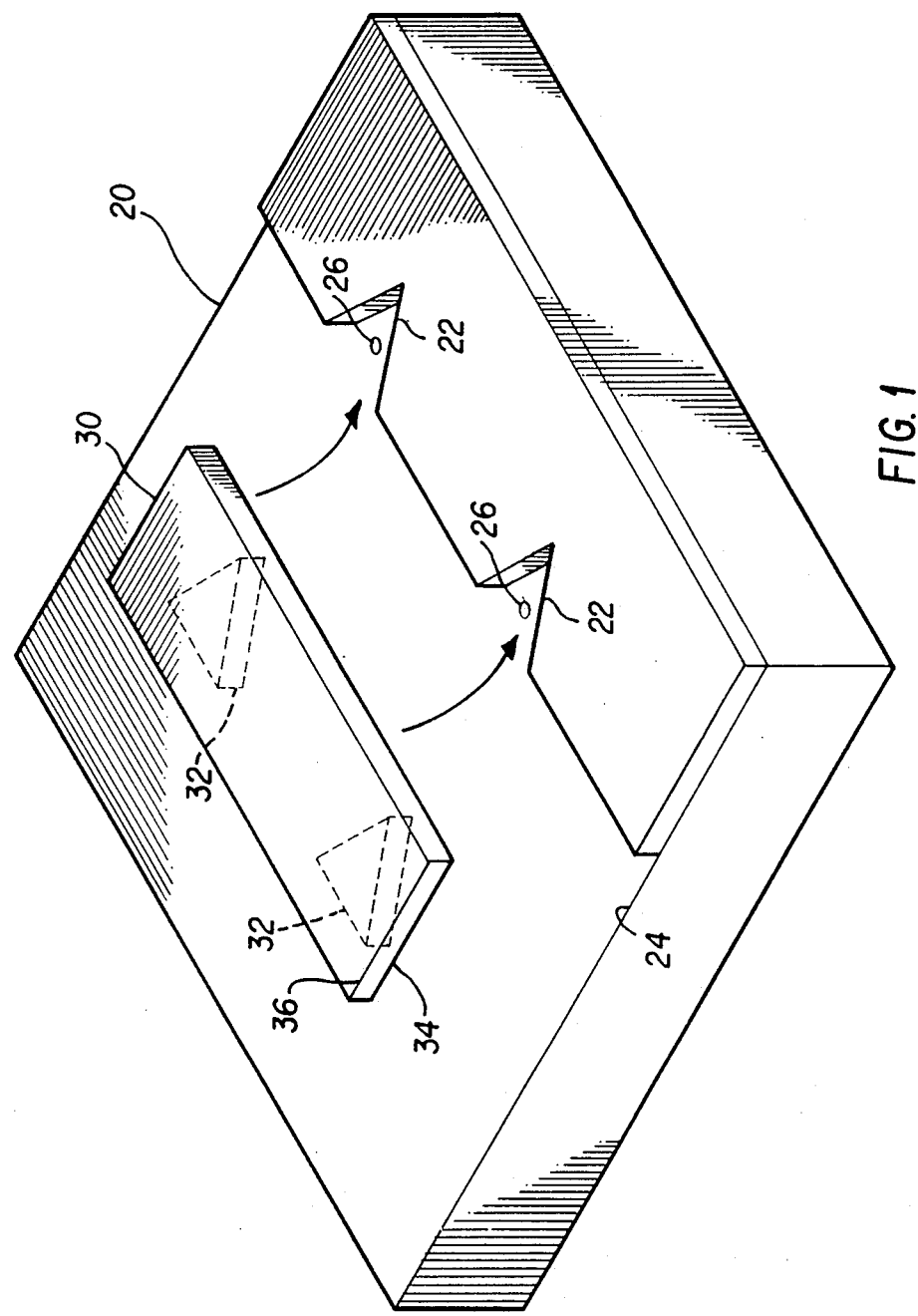
FIG. 1 is an isometric view of a photopatterned alignment substrate of the present invention with a chip having keys formed on one surface placed thereon.

FIG. 1 shows a portion of an alignment substrate 20 of the present invention with a discrete subunit 30 having keys 32 (shown in phantom) located on one surface 34 of the subunit 30. The discrete subunit 30 can be any type of silicon chip, and particularly any type of rastor scanner or heater plate subunit for thermal ink jet printheads. The keys 32 can be formed on either the integrated circuit surface 34 of the discrete subunits or on the base surface 36 of the discrete subunits 30. The keys can be formed by any suitable method, such as by photopatterning, as disclosed in U.S. patent application Ser. No. 401,379, filed Aug. 31, 1989, the disclosure of which is herein incorporated by reference. FIG. 1 illustrates the keys 32 on the integrated surface 34 so that the subunit is in an inverted position when placed on the alignment substrate 20. One advantage of placing the keys 32 on the circuit surface 34 of the discrete subunits 30 is that extended arrays of subunit 30 are fabricated with their integrated circuit surface facing downwardly, thus permitting the extended array formed by the present invention to contain a series of coplanar integrated circuits. This is most advantageous, particularly when rastor scanners are being formed, since misalignment of the scanning circuitry causes distortion of the images which are scanned or printed. Keys 32 on the circuit surface 34 also lift or space the circuit surface above the surface of the alignment substrate 20, thus protecting the circuit surface from damage due to contact with the alignment substrate.

The keys 32 on the discrete subunits 30 mate with keyways 22 formed by photopatterning on the upper surface 24 of the alignment substrate 20. Vacuum holes 26 are formed through the alignment substrate 20 and preferably are located within the keyways 22. After a discrete subunit 30 is placed on the alignment substrate 20 and precisely positioned using the keys 32 and keyways 22, a vacuum is applied through the vacuum holes 26 to securely hold the discrete subunit 30 in place. The process is repeated for subsequent discrete subunits 30 to form an array of desired length. The array of keyed subunits 30 is then adhesively locked in place by a bonding substrate as described in detail herein.

The alignment substrate can be made from a variety of materials, a preferred material being (100) silicon. A (100) silicon wafer can be used to form a plurality of alignment substrate subunits which can then be secured, end to end, to one another to form a full length alignment substrate which in turn is used to align a plurality of discrete subunits 30 to the desired length, for example a pagewidth. The keywayed alignment substrate subunits are adhesively locked in place after being aligned by a keyed member as described in detail herein. One three inch silicon wafer is capable of producing four alignment substrate subunits totalling a 9.6 inch array. It is noted that patterning control within a single wafer may be slightly better than between different wafers. Extracting the alignment substrate subunits from one wafer also minimizes the thickness variation between each subunit.

Figure 1A:
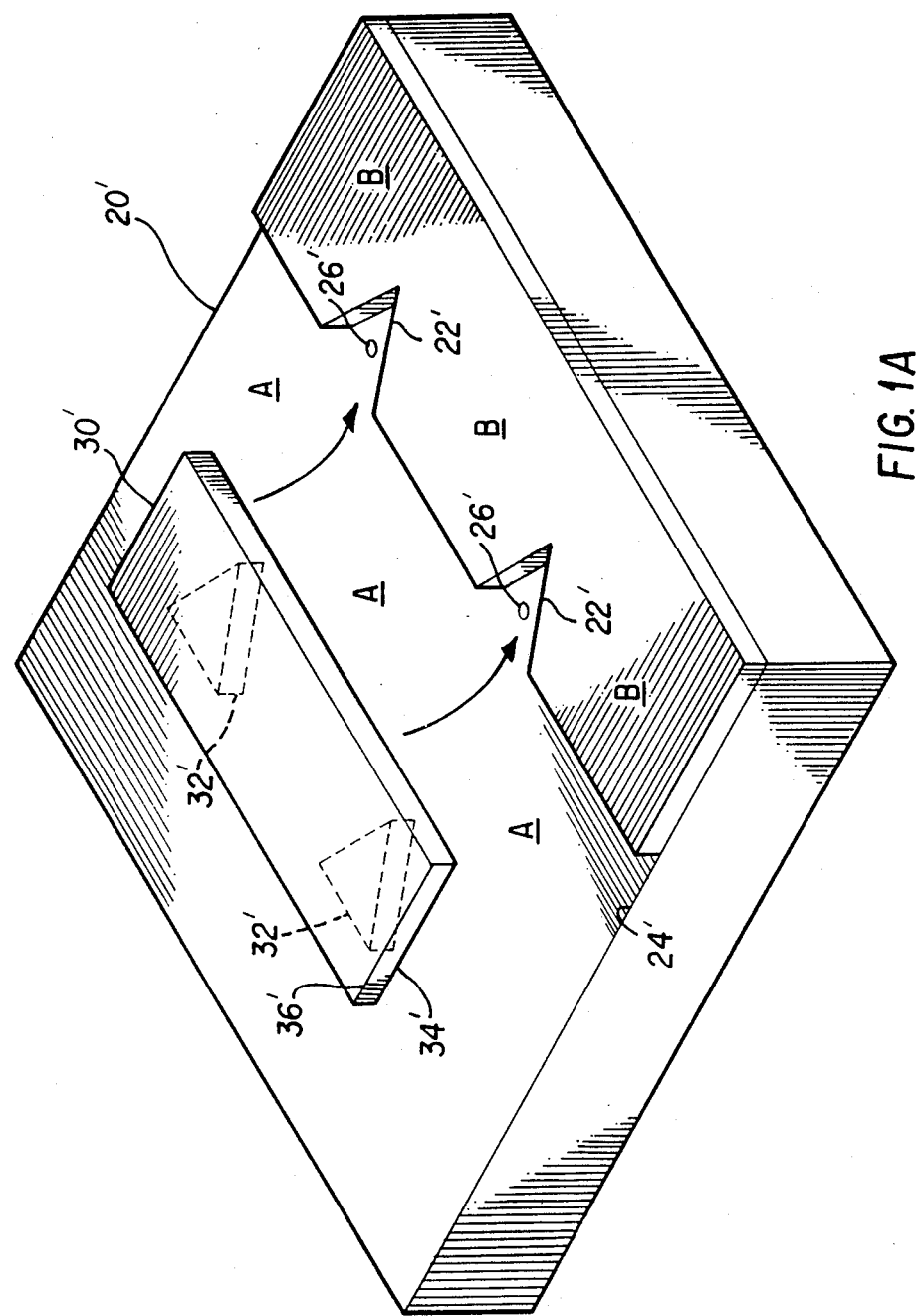
FIG. 1A is an isomeric view similar to FIG. 1, but illustrating an alignment pattern formed by photopatterning a mask on a conductive substrate and then electroforming the keyway pattern.

The vacuum alignment substrate can be fabricated in several ways. One method for fabricating pagewidth substrates is to use a drilled and polished substrate upon which a dry film resist can be laminated and photo-patterned to produce a keyway pattern with the vacuum holes accurately placed within the keyway pattern. An alternative method is illustrated in FIG. 1A which is similar to FIG. 1 except that the identified elements are denoted with a prime (e.g. keyways 22'). In the method illustrated in FIG. 1A, a dry film photoresist is patterned in the area A of drilled and polished conductive substrate 20' to form the negative of the desired keyway pattern. The keyway pattern can then be electroformed (for example, with nickel) in the area B not covered by the photoresist. The photoresist is then removed from area A. This method provides the advantge of using photofabrication techniques to obtain metal keyways having increased wear resistance.

Figure 2A:
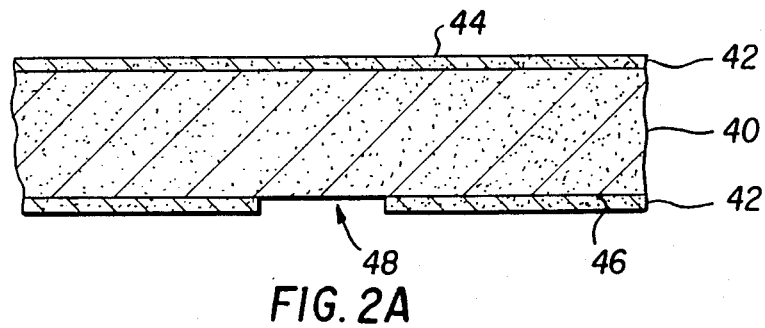
FIGS. 2A-2D are cross sectional views of an alignment substrate during one fabrication process.
Figure 2B:
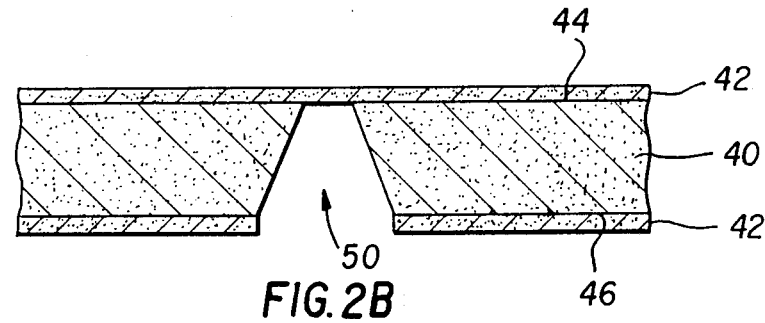
Figure 2C:
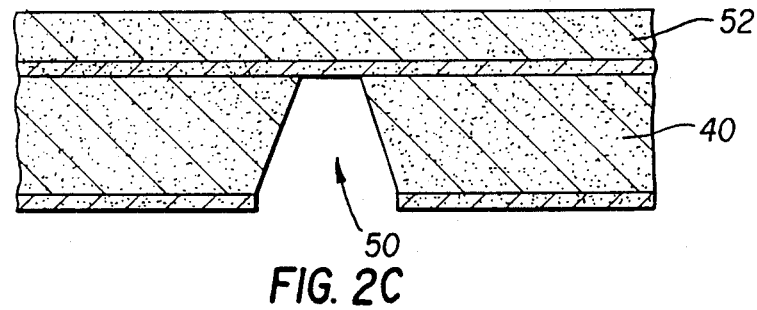
Figure 2D:
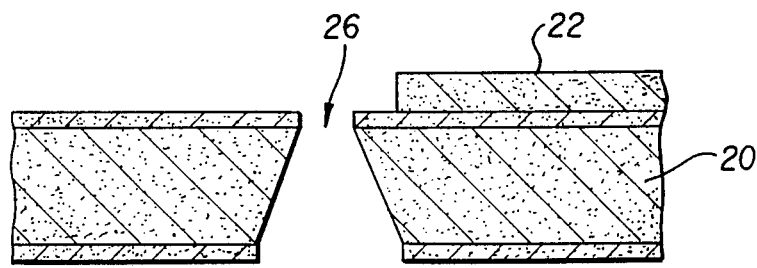

Another method, illustrated in FIGS. 2A-2D would be to use orientation dependent etching (ODE) to etch the vacuum holes in a silicon wafer 40. FIG. 2A shows a portion of the silicon wafer 40 which has a thin masking layer 42 applied on both its upper 44 and lower 46 surfaces. The masking layer 42 can be, e.g., silicon nitride. The masking layer 42 on the lower surface 46 of the wafer is patterned to include an opening 48 and a hole 50 is etched through the entire thickness of the wafer, as shown in FIG. 2B, to form the vacuum holes 26. The etchant, which can be, e.g., etches entirely through the wafer 40 without etching through the masking layer 42 which is on the upper surface 44 of the wafer 40. Thus the upper surface of the wafer remains solid. Next, as demonstrated in FIG. 2C, a dry film resist can be laminated or photosensitive thick films (e.g., polyimide) can be spun on the upper surface 44 of the wafer. This film 52 can be patterned and partially removed (FIG. 2D) to form the keyway pattern 22 on the upper surface 44 of the wafer 40 (the V-shape form of the keyway 22 is not shown in FIG. 2D for clarity). The silicon nitride remaining on the upper surface can be removed by a light $CF_4$ plasma etch, to form the alignment substrate 20 shown in cross-section in FIG. 2D. As noted above, one 3 inch wafer 40 can be processed to fabricate four alignment substrates 20 which are separated from the wafer to create a plurality of alignment substrate subunits.

Figure 3A:
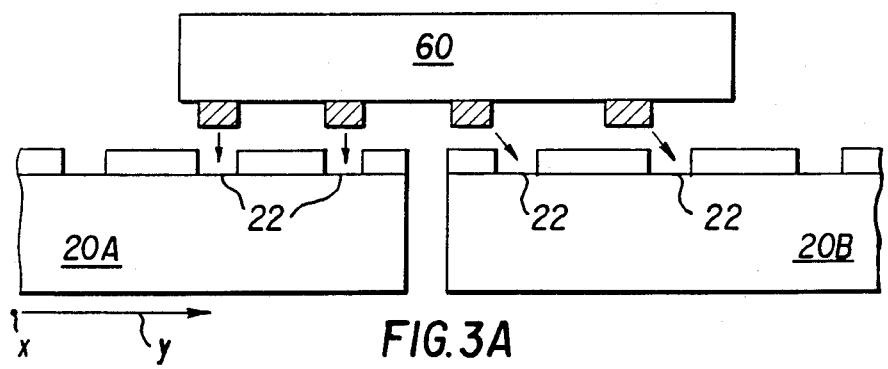
FIGS. 3A-3C are cross-sectional views of a process for assembling a series of alignment substrate subunits into a full length alignment substrate.
Figure 3B:
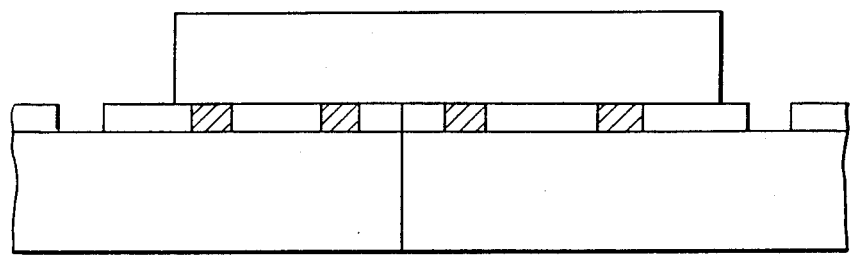
Figure 3C:
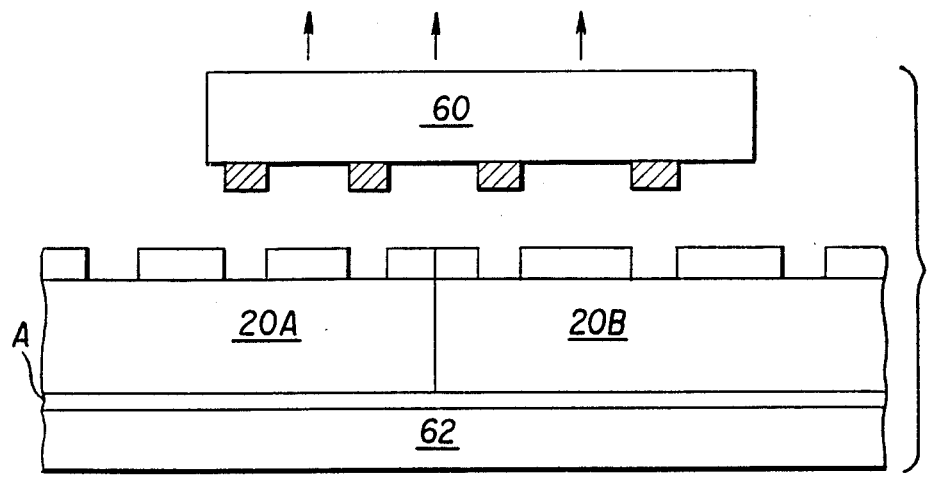
Figure 8:
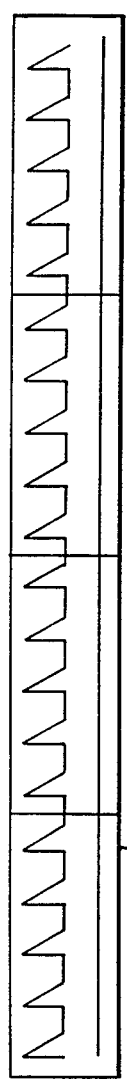
FIG. 8 is a top view of an alignment substrate for assembly of a single array of subunits.
Figure 9:
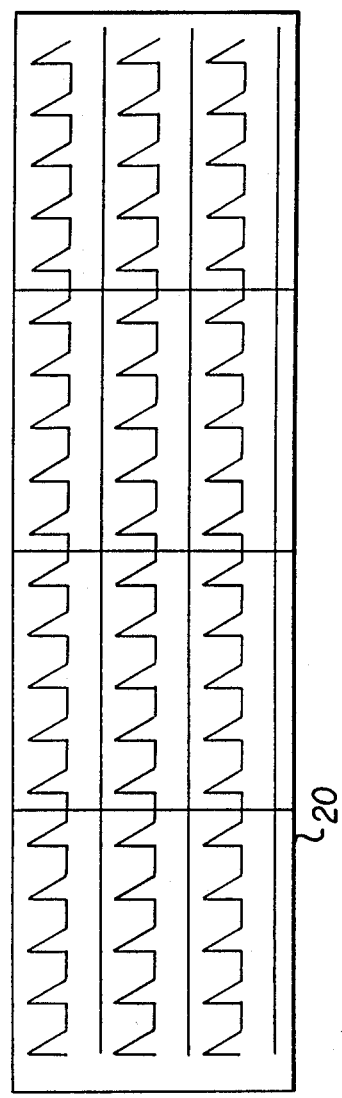
FIG. 9 is a top view of an alignment substrate for an assembly of multiple arrays of subunits.

As shown in FIGS. 3A-3C, adjacent alignment substrate subunits 20A, 20B are precisely aligned with one another by using a keyed member 60 which overlaps and engages the keyways 22 on both alignment substrate subunits 20A, 20B. With the keyed member 60 holding the alignment substrate subunits 20A, 20B in position, a bonding substrate 62 can be adhesively bonded to the aligned substrate subunits 20A, 20B with adhesive A. After curing, the keyed member 60 is removed leaving an aligned array of precisely located alignment substrate subunits. While a member 60 which overlaps and engages only two alignment substrate subunits is shown in FIGS. 3A-3C, those skilled in the art recognize that the member 60 may overlap more than two alignment substrate subunits, and that the array of precisely located alignment substrate subunits may form a full length or pagewidth array of alignment substrate subunits bonded to bonding substrate of corresponding length. When fabricating the alignment substrate from subunits, a straight edge is used to lock the keywayed alignment substrate subunits 20A, 20B in the "Y" axis (represented by arrow Y) while the keyed member 60 aligns the keywayed subunits in the "X" axis (represented by point X). The foregoing method of using a keyed member 60 may be used to produce alignment substrates 20 for assembling single arrays (FIG. 8) or multiple arrays (FIG. 9) of discrete subunits.

Figure 4A:
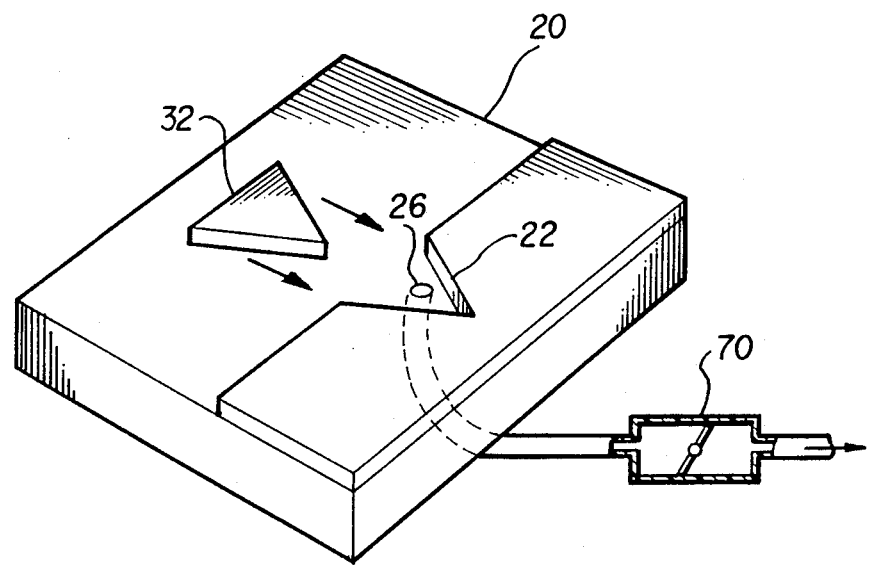
FIGS. 4A and 4B are isometric views of a portion of an alignment substrate during an assembly operation where the vacuum is not applied through the vacuum hole until a key is fully placed into the keyway.
Figure 4B:
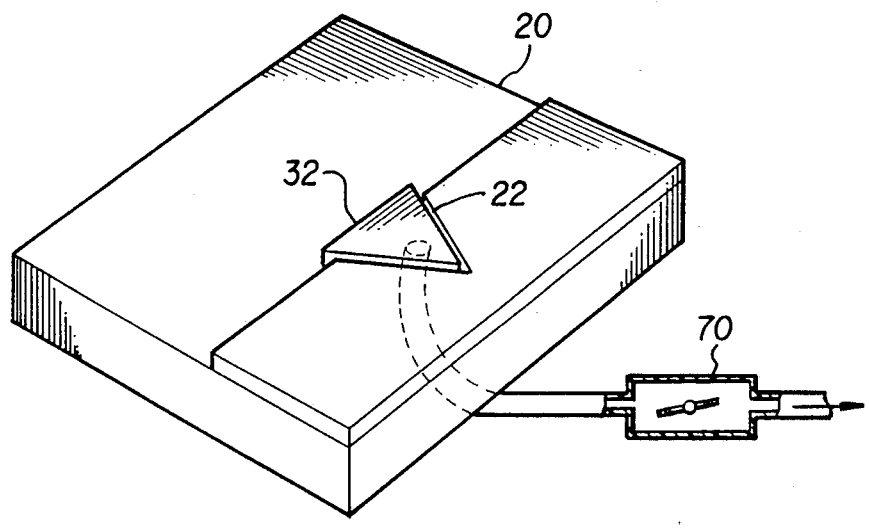

FIGS. 4A and 4B show an alignment substrate arrangement 20 where the keyways 22 are V-shaped to mate with a corresponding v-shaped key 32 formed on the discrete subunit 30. The vacuum holes 26 are spaced at the inner portion of the V-shaped keyways adjacent to the intersection of the legs of the V-shape. As shown in FIG. 4A, the vacuum is not applied prior to placement of the key within the keyway due to closing of the valve 70. As shown in FIG. 4B, once the keys 32 of a discrete subunit 30 are precisely positioned within the keyways 22 of the alignment substrate 20, the valve 70 is opened to apply a vacuum to the vacuum holes 26 so as to secure the discrete subunit 30 in place. While V-shaped keyways are illustrated, other shapes such as slots 80 and rectangular keys 82, shown in FIGS. 12A and 12B can also be used. In FIG. 12A, the keys 82 are located on the integrated circuit surface of the subunit 30, which are then flipped or inverted (FIG. 12B) and aligned in the slots 80.

Figure 5A:
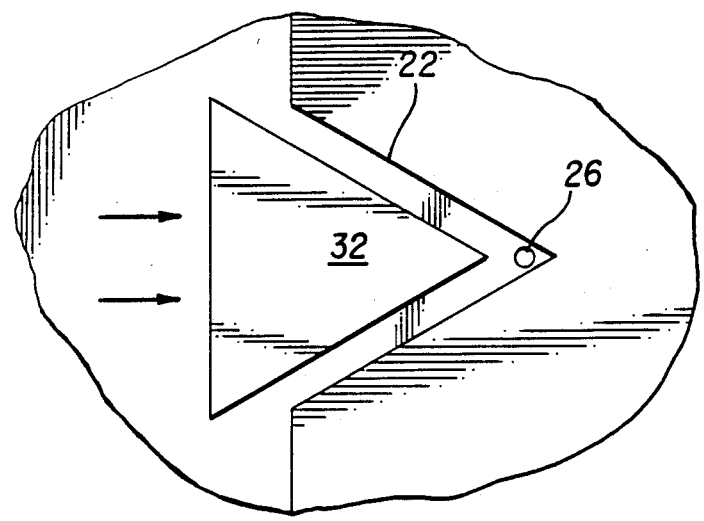
FIGS. 5A and 5B are top views of an arrangement of a vacuum hole in a keyway which permits vacuum to be applied continuously during the alignment process.
Figure 5B:
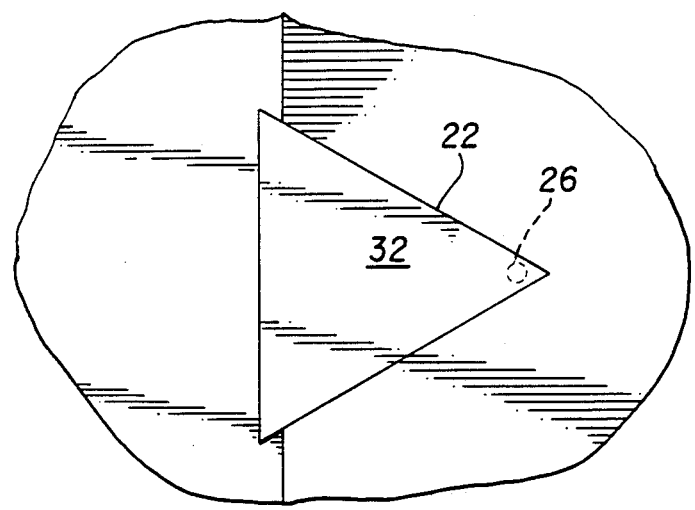

In the embodiment of FIGS. 5A-5B, the vacuum hole 26 is positioned in the inner portion of the keyway 22 adjacent the intersection of the legs of the V-shape. This permits the vacuum to be applied continuously through the vacuum holes regardless of whether or not a key 32 is positioned within a keyway 22. When the vacuum holes are positioned as shown in FIGS. 5A-5B, even though vacuum is continuously applied through the vacuum holes, they will not function to secure a discrete subunit 30 to the alignment substrate 20 until the keys 32 are completely placed within the keyway 22. By eliminating the need to control the application of vacuum to the vacuum holes, a simpler and thus less expensive control system is required.

Figure 6A:
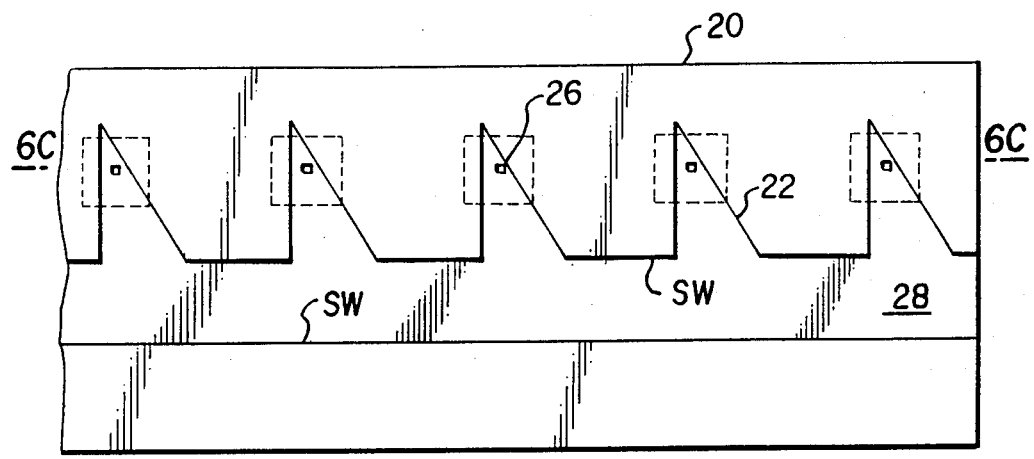
FIGS. 6A, 6B and 6C are top, side and cross-sectional views of a second embodiment of an alignment substrate where a slot is formed in addition to a series of keyways on the upper surface of the alignment substrate.
Figure 6B:
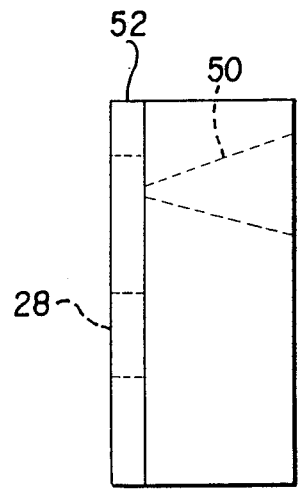
Figure 6C:
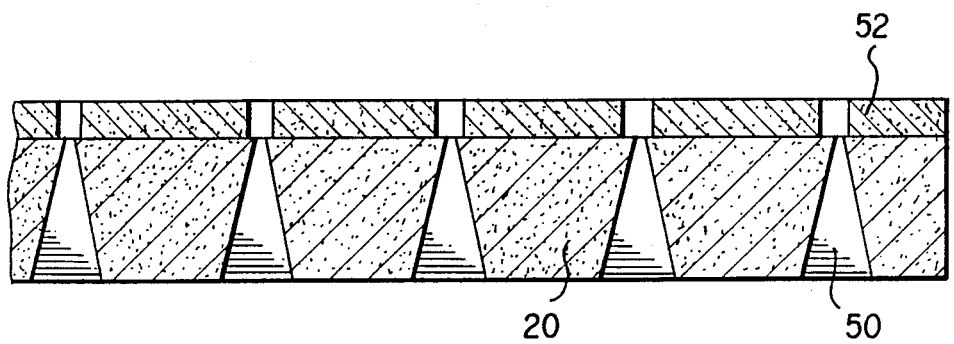
Figure 7:
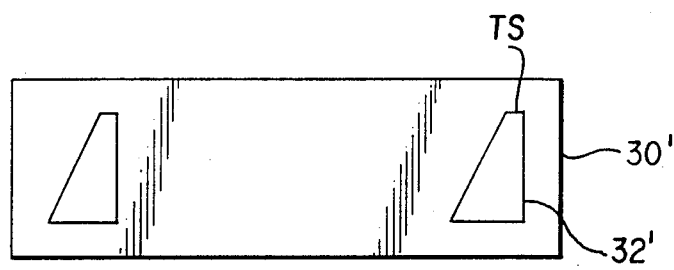
FIG. 7 is a top view of one shape of a key formed in a discrete subunit for alignment in the slot and keying of FIG. 6.

FIGS. 6A, 6B and 6C show an alignment substrate 20 similar to the previously described alignment substrates with the addition of a slot 28 formed along and communicating with the keyways 22 during the photopatterning process. The etch hole 50 and photopatternable film 52 are illustrated in FIGS. 6B and 6C. The series of keyways 22 are oriented in one direction, and the slot 28 is oriented in a perpendicular direction. This alignment substrate is made by methods similar to those previously described except the dry film resist or photosensitive thick film is patterned to include the slot 28 in addition to the keyways 22. In this embodiment a lesser amount of the dry film resist or photosensitive thick film is removed from the upper surface of the alignment substrate. As illustrated in FIG. 7, a modified subunit 30' having truncated triangular keys 32' can be used with the slot 28 of FIG. 6 such that the truncated surfaces TS of the keys 32' engage the side walls SW of the slot 28. The side walls SW of the slot 28 thus guide the subunit 30' into registry with the keyways 22.

While the aligning keyways are illustrated on the alignment substrate with the cooperating aligning keys on the discrete subunits, the alignment formation types may be reversed so that the keyways are formed on the discrete subunits and the keys formed on the alignment substrate.

Figure 10:
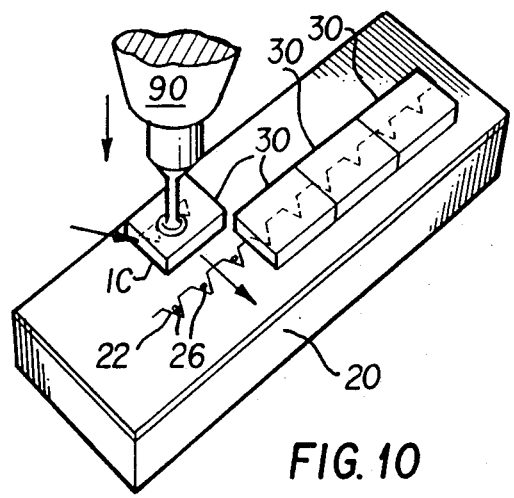
FIG. 10 is an isometric view of an assembly step in a method of fabricating an extended array of subunits whereby a subunit is placed on an alignment substrate by a programmable automatic placement system.
Figure 11A:
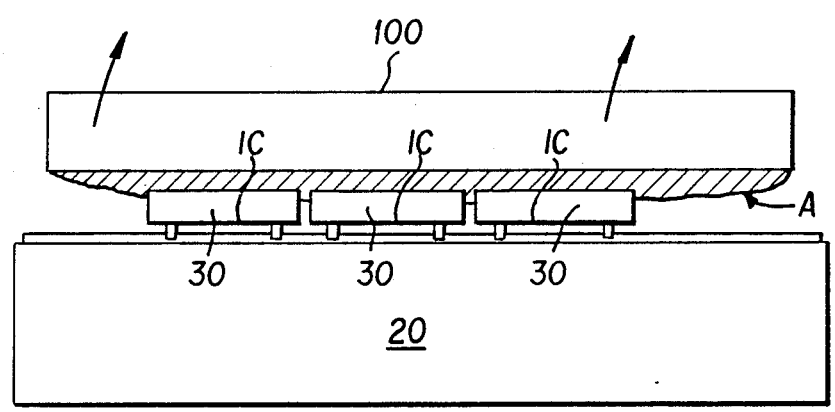
FIGS. 11A and 11B are plan views of a butting jig arrangement which lowers a host substrate onto an extended array of subunits and inverts the resulting structure.
Figure 11B:
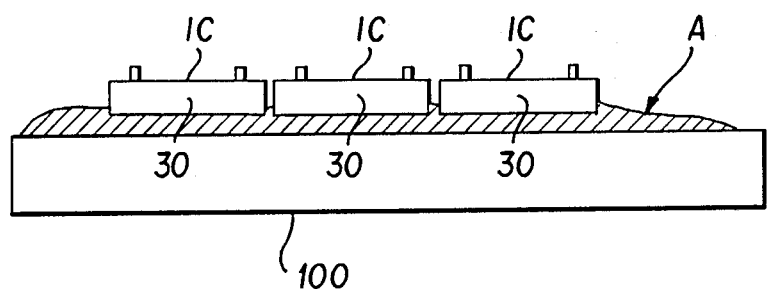

After the alignment substrate is fabricated, extended arrays can be assembled automatically using any one of a number of programmable die placement systems. One type of placement system usable in the present invention is a hybrid assembly station (HAS-1000) manufactured by Teledyne-TAC, Woburn, Mass. The specification of this automated die placement system is ±2 mils as delivered. With the keywayed/key approach, discrete wafer subunits 30 are selected from a plurality of subunits by a programmable vacuum chip carrier 90 (FIG. 10), which moves the inverted subunit 30 (with the integrated circuit IC down) to the general region of placement, and slides the subunit across the surface of the aligment substrate 20 into the keyway 22 with vacuum ports 26. At this point, controls trigger the vacuum hold for that keyed device, if necessary. The machine then releases the selected subunit to select the subsequent subunit to be placed. When the alignment of the array is complete, a host or bonding substrate 100 (FIG. 11A)

with adhesive A is lowered to contact the array of subunits 30. A butting jig (not shown) on which the alignment substrate can be located, pivotably holds the host substrate 100 which can be automatically lowered onto the array. The host substrate 100 is shown after it has been lowered onto the array in FIG. 11A. The array is tacked on line in approximately 10 seconds via an ultraviolet curable adhesive. Vacuum is turned off and the completed array is removed and post cured if necessary. FIG. 11B illustrates the completed structure reinverted with the integrated circuit IC side up.

The host substrate can be, for example, a 0.06 inch thick glass substrate. Alternatively, when the discrete subunits are placed on the alignment substrate with their circuit surfaces facing upward, the alignment substrate itself can be bonded to the extended array to form an integral full width array. Additionally, the alignment patterns can be located on the alignment substrate so that thermal expansion gaps will be formed between the discrete subunits.

The ability to produce precisely dimensioned alignment substrate subunits from photopatternable material, and the ability to assemble a precisely aligned array of alignment substrate subunits, are valuable initial steps to production of a pagewidth array of subunit devices. The present invention provides these initial first steps by forming the alignment substrate subunit from photopatternable material, and assembling the subunits into a precisely aligned array for use in aligning other subunit devices.

The invention has been described in terms of its preferred embodiments which are intended to be illustrative, not limiting. Various modifications may be made without departing from the spirit and scope of the invention as defined in the appended claims.

What is claimed is:

1. A method of making an alignment substrate for use in aligning a plurality of wafer subunits into an extended array of subunits, the method comprising the steps of:
   obtaining a relatively flat substrate having upper and lower surfaces; and
   forming a plurality of alignment patterns on the upper surface of the substrate, the alignment patterns being formed by polishing at least the upper surface of the substrate, coating the upper surface of the substrate with a photopatternable material, photopatterning the photopatternable material to produce the alignment patterns, and removing a portion of the photopatternable material to produce the alignment patterns with the alignment patterns accurately located on the substrate.

2. The method of claim 1, further comprising the steps of forming a plurality of vacuum holes through the substrate between the upper and lower surfaces, said vacuum holes being spaced across the substrate, and said alignment pattern being accurately located relative to the vacuum holes.

3. The method of claim 2 wherein the alignment patterns include recesses, at least one of the vacuum holes being located within each recess.

4. The method of claim 1 wherein the vacuum holes are formed by drilling.

5. The method of claim 2 wherein the flat substrate is a (100) silicon wafer.

6. The method of claim 5 wherein the vacuum holes are formed by etching.

7. The method of claim 5 wherein the substrate is a two side polished (100) silicon wafer and the vacuum holes are formed by:
   coating each side of the wafer with an etch resistant material, patterning and removing a portion of the etch resistant material on the lower surface of the wafer to form a series of evenly spaced vacuum hole openings, and anisotropically etching the wafer through the vacuum hole openings to form the vacuum holes through the wafer.

8. The method of claim 7 wherein the step of anisotropically etching the vacuum holes etches entirely through the wafer without etching through the etch resistant material on the upper surface of the wafer so that a solid surface remains over which is applied the photopatternable material for the alignment patterns, and further comprising the step of removing the etch resistant material from the patterned area of the upper surface of the wafer after the alignment patterns are formed.

9. The method of claim 1 wherein the substrate is a substrate subunit, and further comprising the step of attaching a plurality of substrate subunits together, end-to-end, to form an elongated alignment substrate comprising a substrate array of substrate subunits.

10. The method of claim 9 wherein the substrate array has a length corresponding to a pagewidth.

11. The method of claim 9 wherein the step of attaching a plurality of substrate subunits together comprises the steps of:
   positioning at least two substrate subunits adjacent one another with their ends facing each other and their alignment patterns oriented in the same direction;
   precisely aligning the at least two substrate subunits with one another by engaging an overlapping member having a corresponding alignment pattern with the alignment patterns on each substrate subunit; and
   bonding the substrate subunits to one another to form the substrate array.

12. The method of claim 1 wherein the alignment patterns are V-shaped keyways having two legs intersecting at an inner portion of the keyway.

13. The method of claim 12, wherein a vacuum hole is located in the inner portion of the keyway so that when vacuum is continually applied through the vacuum holes, a correspondingly keyed V-shaped wafer subunit will only be engaged by the vacuum when it is fully inserted into a keyway.

14. The method of claim 1 wherein the alignment patterns are a series of keyways oriented in a first direction.

15. The method of claim 14 wherein the alignment patterns include a slot which is oriented in a second direction perpendicular to the first direction and communicates with the series of keyways.

16. The method of claim 1 wherein the photopatternable material is a dry film resist.

17. The method of claim 1 wherein the photopatternable material is photosensitive polyimide.

18. A method of making an alignment substrate for use in aligning a plurality of wafer subunits into an extended array of subunit, the method comprising the steps of:
   obtaining a relatively flat substrate having upper and lower surfaces; and patterning a dry film photoresist material on a portion of the upper surface of the substrate to define a coated portion and an exposed portion; and electroforming an alignment pattern on the exposed portion of the upper surface and removing the photoresist material from the coated portion.

19. The method of claim 18 wherein the substrate is a conductive substrate.

20. The method of claim 18 wherein a plurality of vacuum holes are formed through the substrate, the alignment pattern being accurately located relative to the vacuum holes.

21. The method of claim 20 wherein the vacuum holes are drilled in the substrate.

22. The method of claim 20 wherein the alignment patterns include recesses, at least one vacuum hole being located within each recess.

23. The method of claim 18 wherein the substrate is a substrate subunit, and further comprising the step of attaching a plurality of substrate subunits together, end-to-end, to form an elongated alignment substrate comprising a substrate array of substrate subunits.

24. The method of claim 23 wherein the substrate array has a high length corresponding to a pagewidth.

25. An alignment substrate for aligning a series of wafer subunits into an extended array comprising:

an elongated substrate having substantially parallel upper and lower surfaces, said upper surface having a relatively thick film of photopatternable material deposited over a portion thereof extending for the length of the substrate, said thick film having a series of alignment patterns formed therein.

26. An alignment substrate as defined in claim 25 wherein the alignment patterns are keyways having at least one vacuum hole located therein.

27. An alignment substrate as defined in claim 26 wherein the keyways are V-shaped, having two legs intersecting at an inner portion of the keyway, and the vacuum holes are located in the inner portion of the keyway.

28. An alignment substrate as defined in claim 25 wherein the elongated substrate is a (100) silicon wafer material.

29. An alignment substrate of claim 25 wherein the alignment substrate is an extended array of alignment substrate subunits aligned end-to-end and attached to one another.

30. An alignment substrate of claim 29 wherein the alignment substrate has the length of a pagewidth.

31. An alignment substrate of claim 28 wherein the vacuum holes are anisotropically etched through-holes.

32. An alignment substrate of claim 25 wherein the thick film is a dry film resist material.

33. An alignment substrate for aligning a series of wafer subunits into an extended array comprising:

an elongated substrate having substantially parallel upper and lower surfaces, said upper surface having an electroformed material deposited over a portion thereof extending for the length of the substrate, said electroformed material a series of alignment patterns formed therein.

34. The alignment substrate of claim 33 wherein the alignment patterns are keyways having at least one vacuum hole located therein.

35. The alignment substrate of claim 33 wherein the elongated substrate is a conductive substrate.

36. The alignment substrate of claim 33 wherein the alignment substrate is an extended array of alignment substrate subunits aligned end-to-end and attached to one another.

37. A method of assembling an extended array of discrete subunits comprising the steps of:

(a) selecting a discrete subunit from a plurality of subunits, each having an alignment pattern thereon;

(b) placing the selected subunit on an elongated alignment substrate, said alignment substrate having a plurality of corresponding alignment patterns formed in one of a photopatternable and electroformable material with associated vacuum holes formed in the alignment patterns;

(c) sliding the subunit across the alignment substrate until at least one alignment pattern on the subunit matingly engages at least one alignment pattern on the substrate;

(d) applying a vacuum through at least one vacuum hole associated with the alignment pattern to secure the subunit to the substrate;

(e) releasing the selected subunit and selecting a subsequent subunit;

(f) repeating steps (b) through (e), by placing each subsequent subunit adjacent to the previously selected subunit until an array of subunits having the desired length is formed; and (g) bonding the subunits into an integral extended array of subunits.

38. The method of claim 37 wherein the extended array has the length of a pagewidth.

39. The method of claim 37 wherein the subunits have integrated circuitry on the surface which is placed on the alignment substrate so that the extended array is formed with the circuit surfaces facing downwardly to form an extended array of subunits having their circuit surfaces in a common plane regardless of differences in thickness between adjacent subunits.

40. The method of claim 37 wherein the subunits are selected, placed and slid by a programmable automatic placement system.

41. The method of claim 37 wherein the subunits are scanning arrays.

42. The method of claim 37 wherein the subunits are for a thermal ink jet printhead.

43. The method of claim 37 wherein the step of bonding includes lowering a host substrate onto the array, tacking the subunits to the host substrate with a curable adhesive, and curing the adhesive.

44. The method of claim 37 wherein the alignment substrate is bonded to the subunits to form the extended array.

45. The method of claim 37 wherein the elongated substrate is formed from a plurality of precisely aligned alignment substrate subunits assembled end-to-end.

46. The method of claim 45 wherein each alignment substrate subunit has an alignment pattern formed in photopatternable material.

* * * * *